United States Patent [19]

Ulmer, Jr. et al.

[11] Patent Number: 4,755,665
[45] Date of Patent: Jul. 5, 1988

[54] LIGHT DETECTOR AND SIGNAL PROCESSING CIRCUIT

[75] Inventors: Edward A. Ulmer, Jr., Clearwater; William P. Hooper, Largo, both of Fla.

[73] Assignee: Square D Company, Palatine, Ill.

[21] Appl. No.: 76,524

[22] Filed: Jul. 22, 1987

[51] Int. Cl.$^4$ .......................... G01R 31/00; G01J 4/00
[52] U.S. Cl. ................................. 250/214 R; 324/96; 356/368; 250/206; 250/225
[58] Field of Search ............... 250/206, 214 R, 214 A, 250/225, 216; 324/96, 117 R, 140 D; 356/368, 367, 365; 350/374–376, 384

[56] References Cited

U.S. PATENT DOCUMENTS

| | | | |
|---|---|---|---|
| 3,930,733 | 1/1976 | Holly | 356/349 |
| 4,329,054 | 5/1982 | Bachalo | 356/336 |
| 4,539,521 | 9/1985 | Matsumoto | 324/96 |
| 4,547,729 | 10/1985 | Adolfsson et al. | 324/96 |
| 4,581,579 | 4/1986 | Nagatsuma et al. | 350/375 |
| 4,584,470 | 4/1986 | Iizuka et al. | 324/96 |
| 4,724,393 | 2/1988 | Kumada et al. | 324/140 D |
| 4,730,931 | 3/1988 | Watson | 250/571 |

Primary Examiner—Edward P. Westin
Assistant Examiner—Charles F. Wieland
Attorney, Agent, or Firm—A. Sidney Johnston; Richard T. Guttman

[57] ABSTRACT

A light detector measures the intensity of two different light beams, computes a ratio of an AC to a DC component for each light beam, and computes a quotient by dividing a first of the above ratios by a second of the above ratios. A light detector has a first photodetector, means, responsive to the first photodetector, for computing a first ratio of an AC component to a DC component of the intensity of a first light detected by the first photodetector, means for producing a first average value of the first ratio, a second photodetector, means, responsive to the second photodetector, for computing a second ratio of an AC component to a DC component of the intensity of the second light detected by the second photodetector, means for producing a second average value of the second ratio, and means for computing a quotient by dividing the first average value of the first ratio by the second average value of the second ratio.

12 Claims, 5 Drawing Sheets

LIGHT DETECTOR AND SIGNAL PROCESSING CIRCUIT

This invention relates to detectors for quantitatively measuring the intensity of a light beam, and more particularly relates to light detectors for measuring the ratio of an alternating, AC, component to the constant, DC, component of the intensity of a light beam.

BACKGROUND OF THE INVENTION

In the development of an electric current measuring apparatus utilizing the Faraday effect, it is necessary to measure the intensity of two different light beams. Also, it is necessary, for each of the light beams, to compute the ratio of the alternating, AC, component of the intensity to the constant, DC, component of the intensity.

It is further necessary to compute a quotient by dividing an average value of the above ratio for the first light beam by an average value of the ratio for the second light beam.

Further, in those situations in which it is desired to make a measurement of electric current flow by use of the Faraday effect, and to make the measurement to a precision of 0.1%, it is necessary to compute the quotient to an accuracy of better than 0.1%.

Existing light detectors have been found inadequate to compute the above mentioned quotient, and further, to compute such a quotient to an accuracy of better than 0.1%.

SUMMARY OF THE INVENTION

The invention is a light detector for measuring the intensity of two different light beams, computing a ratio of an AC to a DC component for each light beam, and for computing a quotient by dividing a first of the above ratios by a second of the above ratios. A light detector has a first photodetector, means, responsive to the first photodetector, for computing a first ratio of an AC component to a DC component of the intensity of a first light detected by the first photodetector, means for producing a first average value of the first ratio, a second photodetector, means, responsive to the second photodetector, for computing a second ratio of an AC component to a DC component of the intensity of the second light detected by the second photodetector, means for producing a second average value of the second ratio, and means for computing a quotient by dividing the first average value of the first ratio by the second average value of the second ratio.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

An application for United States patent related to the present application, and filed on even date with the present application, is identified as Ser. No. 76,456, pending, all disclosures of which are incorporated herein by reference.

Figure 1:
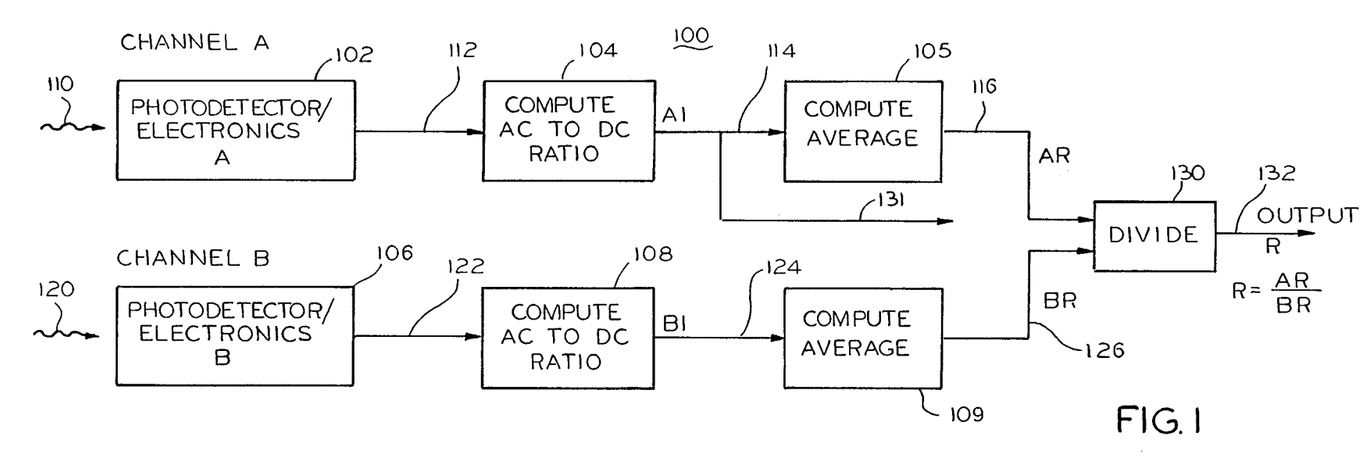
FIG. 1 is a block diagram showing a two channel light detector.

FIG. 1 shows a block diagram of a two channel light detector 100. The two channel light detector 100 has Channel A and Channel B, and computes a ratio R from signals AR and BR generated by light detection Channels A and B.

Channel A comprises photodetector/electronics 102. computation circuit 104: and averaging circuit 105. Channel B comprises photodetector/electronics 106, computation circuit 108, and averaging cuicuit 109.

Light beam 110 is detected by photodetector/electronics 102. A voltage proportional to the intensity of light beam 110 is generated on line 112 by photodetector/electronics 102, and serves as input to computation circuit 104.

Computation circuit 104 develops a voltage proportional to the DC component of the intensity of light beam 110. Also, computation circuit 104 develops a voltage proportional to the AC component of the intensity of light beam 110. Computation circuit 104 then computes the ratio of the AC component of light beam 110 to the DC component of light beam 110 by dividing the voltage proportional to the AC component by the voltage proportional to the DC component. A voltage signal representing the ratio of the AC component to DC component computed by computational circuit 104 is produced on line 114, and is denoted by the symbol A1. An average signal AR is produced as a voltage on line 116 by averaging circuit 105.

Photodetector/electronics 106 of channel B detects the intensity of light beam 120. A voltage proportional to the intensity of light beam 120 is developed on line 122, as the output of photodetector/electronics 106. The voltage developed by photodetector/electronics 106 on line 122 serves as input to computational circuit 108. Computational circuit 108 is substantially identical to computational circuit 104. Computational circuit 108 develops a voltage proportional to the AC component of the intensity of light beam 120, develops a voltage proportional to the DC component of the intensity of light beam 120, and divides the voltage proportional to the AC component by the voltage proportional to the DC component, and generates a signal representing the ratio on line 124. The ratio computed by dividing the AC component of the signal by the DC component of the signal is denoted by the symbol B1. A voltage signal on line 126 is produced from B1 by averaging circuit 108 and is denoted by the symbol BR.

Divider circuit 130 has two inputs, a first input on line 116 carrying a voltage proportional to the signal AR, and a second input on line 126 carrying a voltage proportional to the signal BR. Divide circuit 130 computes a ratio R by dividing the voltage proportional to AR on line 116 by the voltage proportional to BR on line 126. The quotient is represented by the symbol R. A voltage proportional to R is produced by divide circuit 130 on line 132. An output of signal A1 is developed on line 131. Signal A1 and signal R are useful in computing the current flow in a conductor where light beams 110 and 120 are developed in a Faraday effect electric current sensor.

Figure 2:
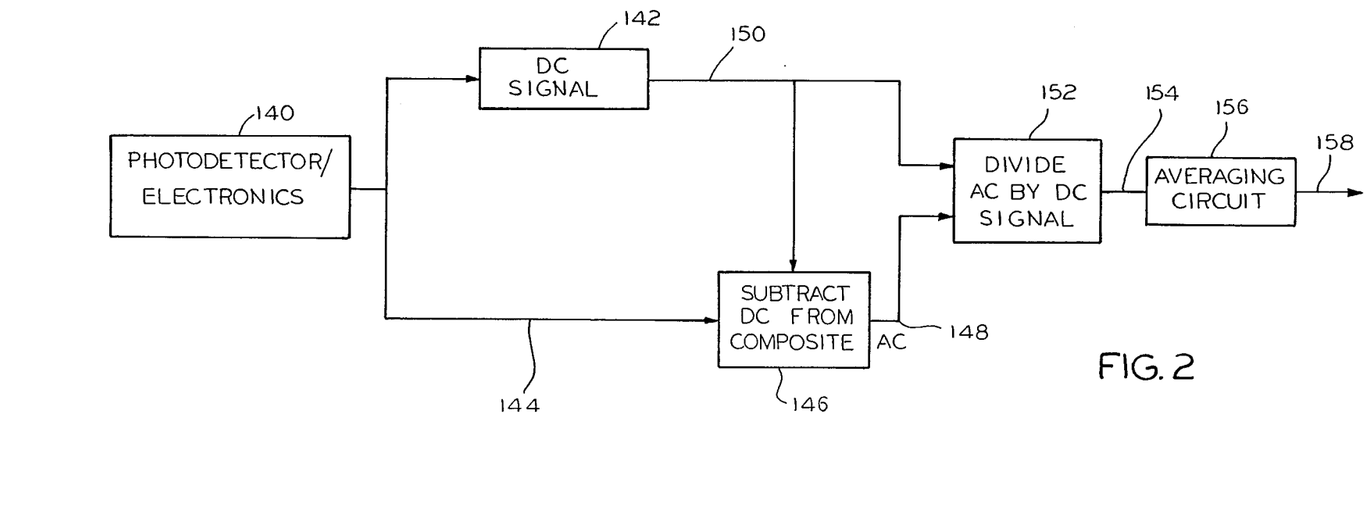
FIG. 2 is a block diagram showing a channel of a light detector.

FIG. 2 is a block diagram showing operation within either channel A or channel B as discussed hereinabove. Photodetector/electronics 140 represents either photodetector/electronics 102 or photodetector/electronics 106. Photodetector/electronics 140 sends a composite signal 144 to both a DC processing circuit 142 and the subtractor circuit 146.

A signal proportional to the DC component of the light signal detected by photodetector/electronics 140 appears on line 150. Subtract circuit 146 subtracts a DC voltage equal to the DC component of the composite signal from the composite signal. The remainder is generated by subtract circuit 146 as an AC voltage signal proportional to the AC component of the light signal detected by photodetector/electronics 140. The AC signal appears on line 148.

Divide circuit 152 has two inputs, a first input on line 148 carrying a voltage substantially proportional to the AC signal developed by photodetector/electronics 140, and a second input on line 150 carrying a voltage substantially proportional to the DC component of the signal developed by photodetector/electronics 140. Divide circuit 152 divides the voltage proportional to the AC signal by the voltage proportional to the DC signal, and generates the quotient as an AC voltage signal on line 154.

Line 154 serves as an input to an averaging circuit 156 which computes a DC voltage signal on line 158 proportional to the average amplitude of the signal on line 154. The method of averaging can be a technique using a half-wave or full-wave rectification followed by an integration, an RMS computation, or other equivalent means.

The ratio produced on line 154 by divide circuit 152 may serve channel A as the quantity A1 on line 114, or may serve channel B as the quantity B1 on line 124.

The signal created on line 158 by averaging circuit 156 may serve channel A as the quantity AR on line 116, or may serve channel B as the quantity BR on line 126.

Figure 3:
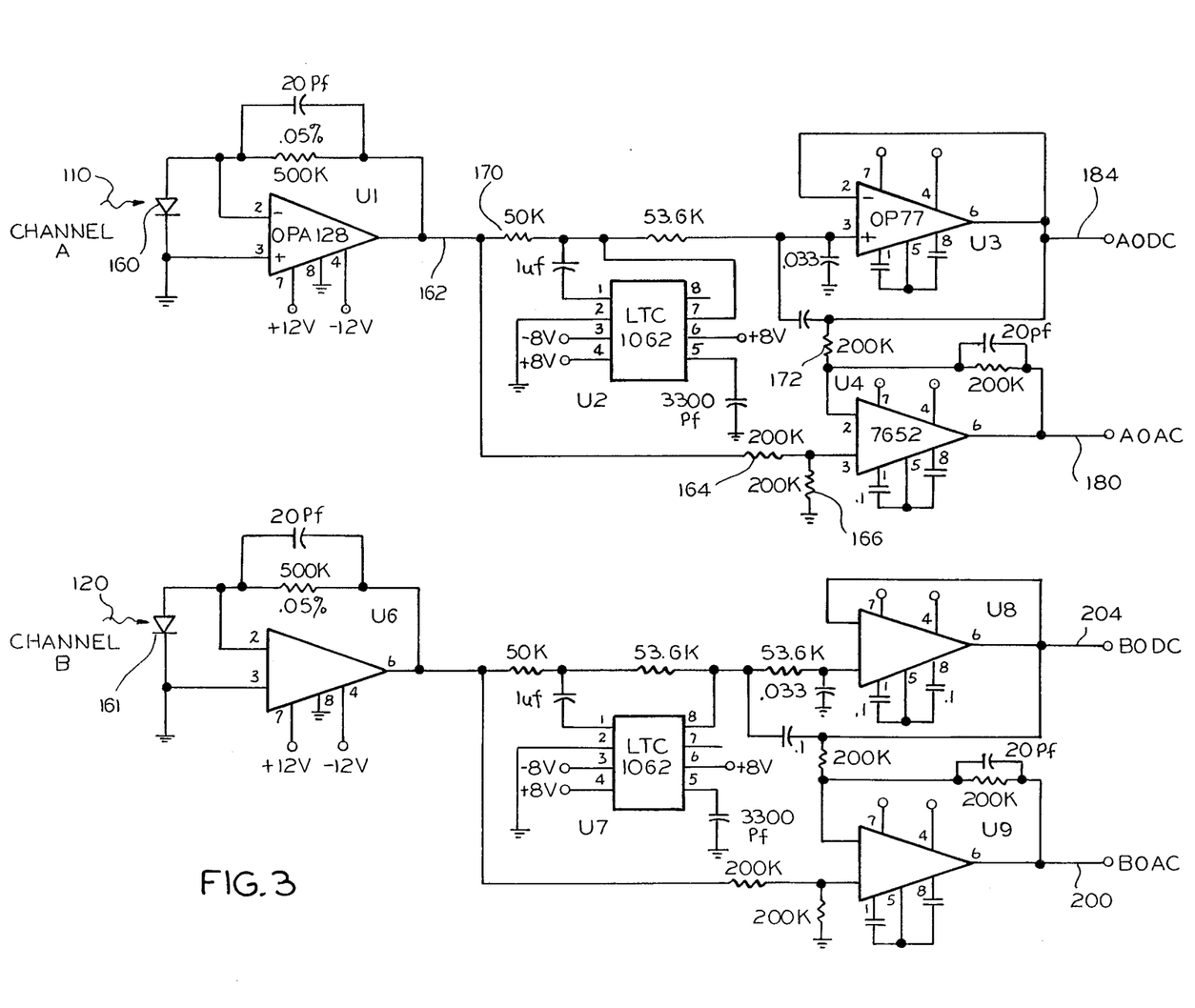
FIG. 3 is a schematic diagram of a light detector.

FIG. 3 is a schematic diagram of the photodetector and preamplifier, and also an AC- DC separation circuit. Photodiode 160 detects the intensity of incident light beam 110. Op amp U1 develops an output voltage on line 162 proportional to the intensity of light beam 110. For example, the output voltage of U1 on line 162 may be given approximately by the relationship $$V = 500\ I_{diode},$$

as operational amplifier U1 may have a 500 k ohm feedback resistor and I is measured in milliamperes, and V in Volts.

The voltage on line 162 serves as input to two circuits. The first circuit for which the voltage on line 162 serves as an input is composite amplifier U4, and begins with the voltage divider comprising resistor 164 and resistor 166. The voltage from the junction of resistors 164, 166 serves as input to pin 3 of operational amplifier U4. The voltage appearing at pin 3 of operational amplifier U4 is a composite voltage proportional to both the AC component of the intensity of light beam 110 and the DC component of the intensity of light beam 110.

The second circuit for which the voltage on line 162 serves as an input is the DC separation circuit, and begins with resistor 170. Resistor 170 connects to pin 7 of U2. U2 is a 5 pole filter device. It has been found convenient to use for U2 a part made by Linear Technologies Corporation, of Milpitas, Calif., part No. LTC1062. U2 is a digital switched filter. U2 works in conjunction with operational amplifier U3 to form a 7 pole filter. A voltage AODC is developed at pin 6 of U3 proportional to the DC component of the intensity of light beam 110.

Subtraction of the DC signal from the composite signal is accomplished by a connection between operational amplifiers U3, U4. The DC voltage developed at pin 6 of operational amplifier U3 is applied to operational amplifier U4 through resistor 172 to pin 2 of U4. The circuit of U4 provides that the DC voltage developed at pin 6 of U3 is subtracted from the composite signal applied at pin 3 of U4. An output voltage AOAC is developed by U4 at pin 6 of U4 proportional to the AC component of the intensity of light beam 110.

The circuit made up of U1, U2, U3, and U4 is maintained to have at least 0.1% accuracy by the use of resistors having 0.01% tolerances.

Channel B electronics comprises op amp U6, digital switched filter U7, op amp U8, and op amp U9. A voltage BODC proportional to a DC component of the intensity of light beam 120 is developed by op amp U8 at output pin 6. A voltage BOAC proportional to the AC component of the intensity of light beam 120 is developed at output pin 6 of op amp U9.

Figure 4:
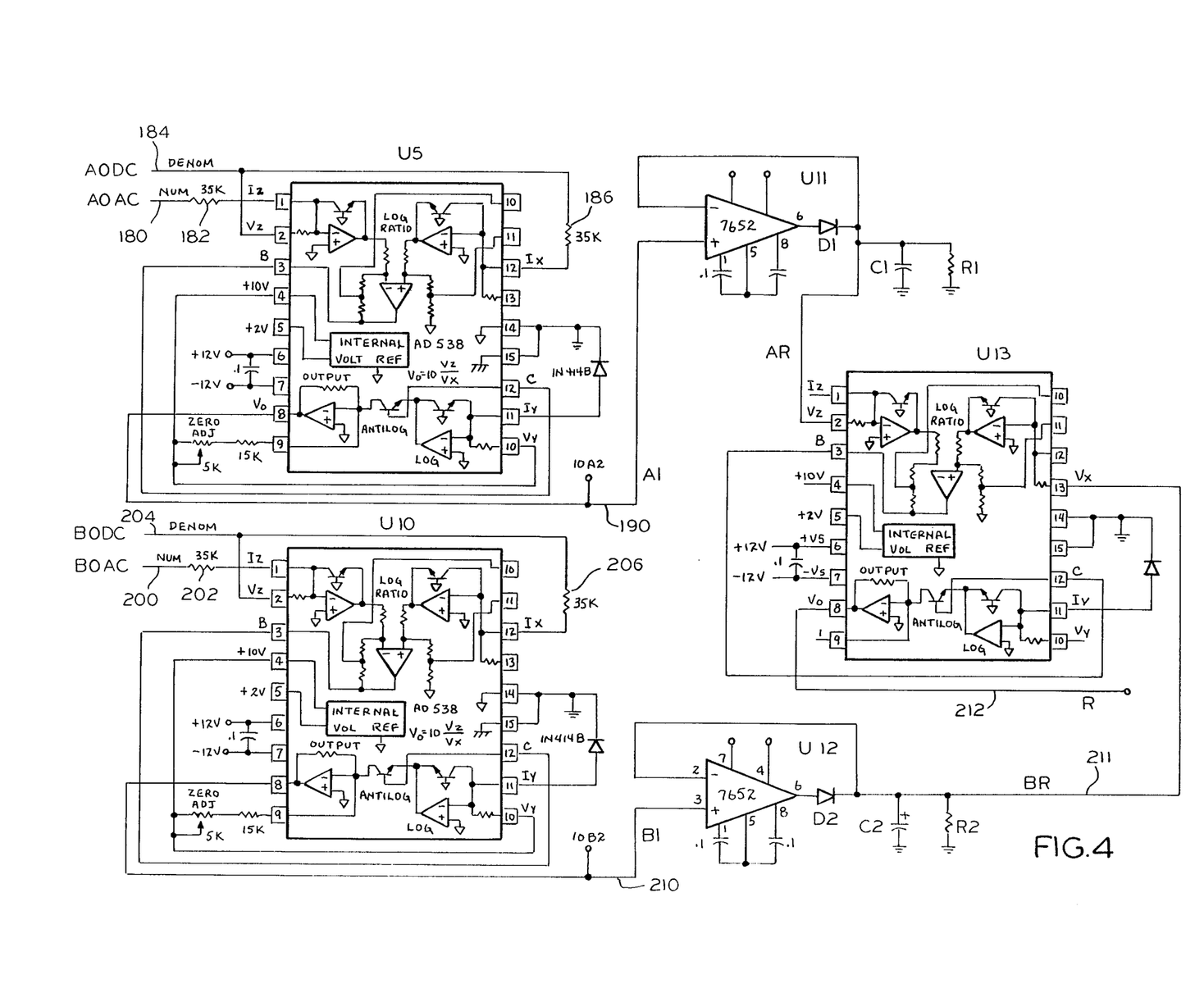
FIG. 4 is a schematic diagram of a light detector.

FIG. 4 is a schematic diagram of a circuit. The circuit of FIG. 4 performs at least the following functions:

1. dividing AOAC, the voltage output by U4 proportional to the AC component of light beam 110, by AODC the voltage output by U3 proportional to the DC component of the intensity of light beam 110 to produce signal A1;
2. dividing BOAC, the voltage output by U9 proportional to the AC component of light beam 120, by BODC, the voltage output by U8 proportional to the DC component of the intensity of light beam 120 to produce signal B1;
3. averaging signal A1 to produce signal AR;
4. averaging signal B1 to produce signal BR; and,
5. dividing signal AR by signal BR to produce the ratio R shown on line 132 of FIG. 1.

U5 is an integrated circuit for dividing the AC voltage by the DC voltage in channel 4. It has been found convenient to use an Analog Devices. Inc. of Norwood, Mass., integrated circuit, part no. AD538 for U5.

The AC output voltage AOAC of U4 at pin 6 appears on line 180, and is connected through resistor 182 to pin 1 of U5. The DC output voltage AODC at pin 6 of U3 appears on line 184, and is connected to pin 2 of U5, and through resistor 186 to pin 12 of U5. The result of dividing the voltage on line 180 by the voltage on line 184 appears on line 190, and is the signal A1 appearing on line 114. FIG. 1.

U11 is configured to use signal A1 as input to produce an output signal AR on line 192 proportional to an average amplitude of signal A1, where signal AR appears on line 116, FIG. 1. Op-amp U11 is a peak detector using diode D1 to produce a half-wave rectified signal, and using capacitor C1 and resistor R1 to integrate the rectified signal. Signal AR will vary with time as the AC to DC components of light beam 110 change with time.

The AC output voltage BOAC of U9 at pin 6 appears on line 200, and is connected through resistor 202 to pin 1 of U10. The DC output voltage BODC at pin 6 of U8 appears on line 204, and is connected first to pin 2 of U10, and second through resistor 206 to pin 12 of U10. U10 is an integrated circuit, and it has been found convenient to use a circuit produced by Analog Devices, Inc., part no. AD538. A voltage is developed at line 210 proportional to the ratio obtained by dividing the voltage on line 200 by the voltage on line 204. The voltage on line 210 is signal B1 as appears on line 124 of FIG. 1.

Operational amplifier U12 is configured to use signal B1 as input to produce an output signal BR on line 211 proportional to an average amplitude of signal B1, where signal BR appears on line 126 of FIG. 1. Op-amp U12 is a peak detector using diode D2 to produce a half-wave rectified signal, and using capacitor C2 and resistor R2 to integrate the rectified signal. Signal BR will vary with time as the AC to DC components of light beam 120 change with time.

U13 is an integrated circuit which divides the voltage AR produced at channel A by the voltage BR produced at channel B. An Analog Devices, Inc. part no, AD538 may serve as U13. The output of U13 on line 212 is the quotient obtained by dividing input signal AR by input signal BR, and is the voltage signal denoted by R on line 132 of FIG. 1.

Figure 5:
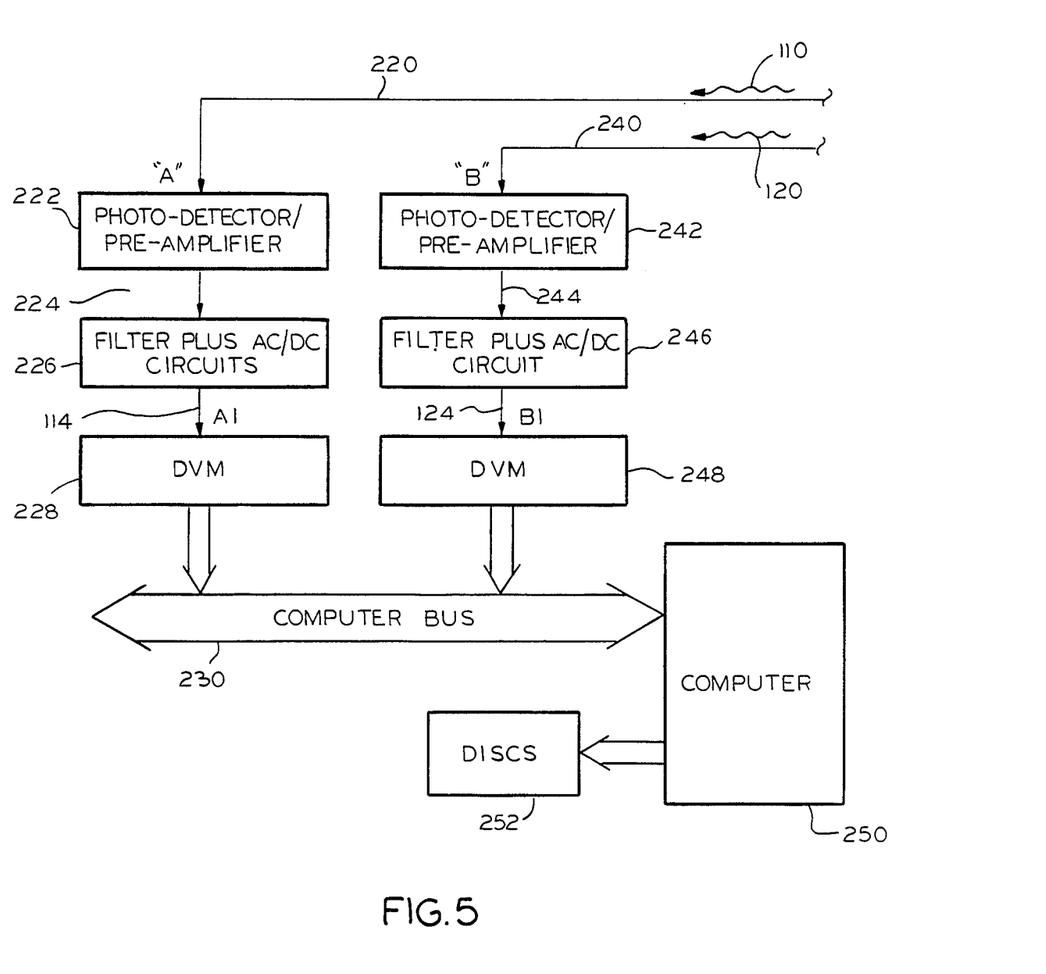
FIG. 5 is a block diagram of a light detector using a computer.

FIG. 5 shows an alternative embodiment of the two channel light detector. Light beam 110 is conducted by fiber optical cable 220 to the channel A photodetector and preamplifier 222. An output voltage from photodetector and preamplifier 222 appears on line 224, and serves as input to "Filter plus AC/DC Circuits" 226. The output of "Filter plus AC/DC Circuits" 226 is the signal A1 shown on line 114 of FIG. 1. The signal A1 is then measured by digital voltmeter (DVM) at block 228. The output of the DVM 228 is coupled to the bus 230 of a computer. The bus connection permits output of DVM 228 to be transferred into computer 250. For example, bus 230 may be an IEEE 488 type bus.

Light beam 120 is conducted by fiber optical cable 240 to the channel B photodetector and preamplifier 242. An output voltage proportional to the intensity of light beam 120 appears at line 244. The voltage on line 244 serves as input to "Filter plus AC/DC Circuits" 246. The output of "Filter plus AC/DC Circuits" 246 is signal B1, as shown on line 124 of FIG. 1. The digital voltmeter (DVM) 248 measures the voltage of signal B1. The output of DVM 248 is coupled to the computer bus 230. The bus connection permits output of DVM 248 to be transferred to computer 250.

Computer 250 may sample the voltages produced by DVM 228 and DVM 248 at desired time intervals. The computer may calculate the ratio of the averages of the output voltages as measured by the two digital voltmeters. This ratio gives the value of R as shown in FIG. 1 on line 132.

Figure 6:
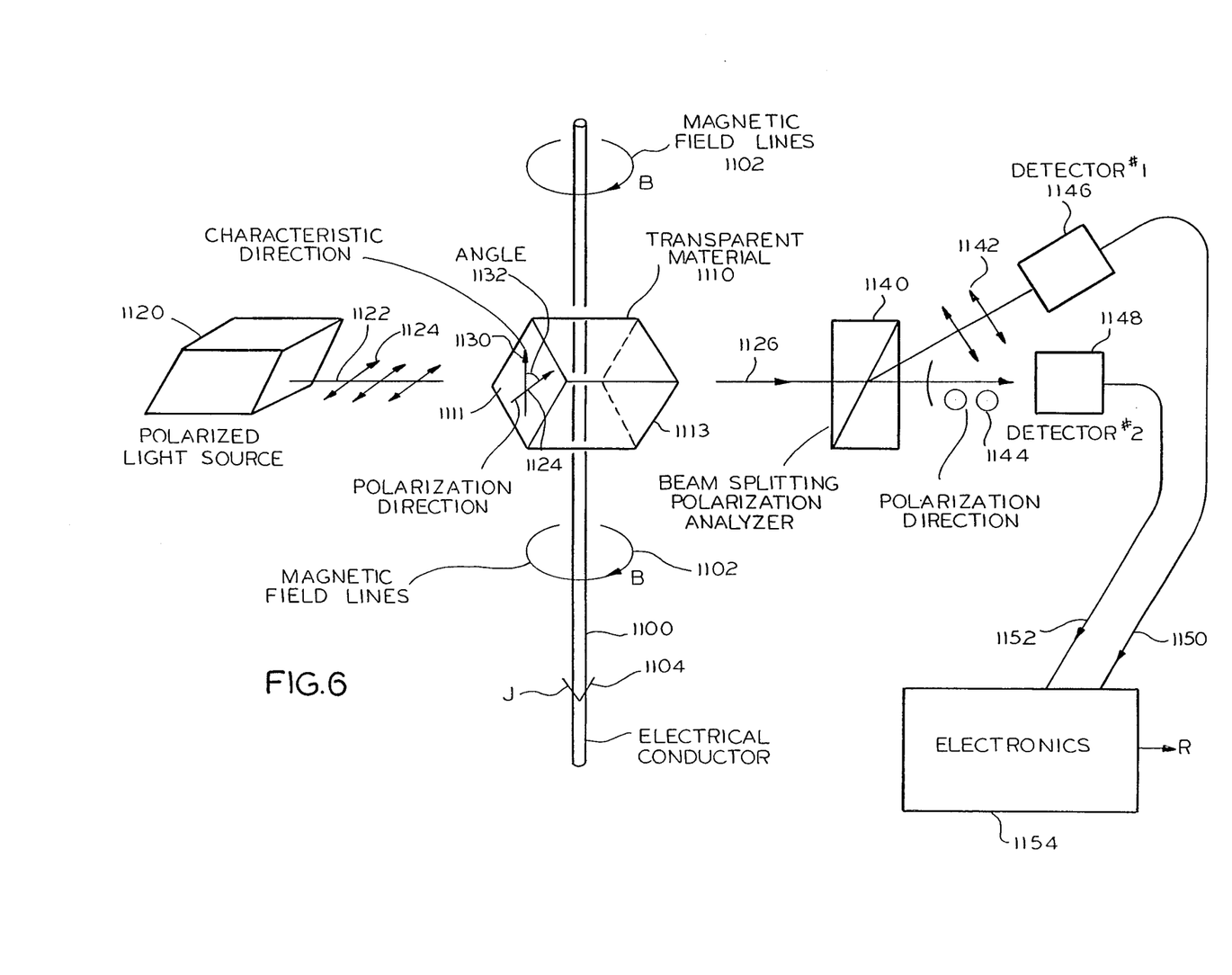
FIG. 6 is a block diagram showing a Faraday effect electric current sensor utilizing a two-channel light detector.

FIG. 6 shows an electric current sensor utilizing the Faraday effect. An alternating electric current of RMS value J flows in conductor 1100. Typical magnetic field lines 1102 are produced by current J when flowing in the direction shown by arrow 1104. The magnetic fields produced by the current J flowing in conductor 1100 penetrate transparent material 1110.

Polarized light source 1120 produces a beam of light 1122 having a linear polarization with the electric field vectors of light beam 1122 oriented in a direction shown by arrows 1124. Light beam 1122 enters transparent material 1110 at entrance face 1111, and exits from the transparent material 1110 at exit face 1113 (shown with dotted lines) as light beam 1126.

The Faraday effect is an induced circular birefringence of a transparent material, where the induced circular birefringence is caused by a magnetic field.

Linearly polarized light can be decomposed into two counter-rotating circularly polarized lightwaves of equal amplitude. In the absence of a magnetic field in an isotropic medium these left-hand and right-hand circularly polarized lightwaves travel at equal velocity. The two indicies of refraction n and $n_r$ for the left-hand and right-hand lightwaves are equal. The magnetic field creates a difference between $n_l$ and $n_r$. One circular polarization travels faster than the other, and the net effect is a rotation of the linearly polarized light that is produced when the two circular lightwaves are recomposed.

The state of polarization of light beam 1122 is changed by interaction with transparent material 1110. The change in the state of polarization is caused by both the Faraday effect resulting from the magnetic field produced by the current J flowing in conductor 1100, and other properties of the transparent material 1110. Stress birefringence in transparent material 1110 is particularly important in causing a change in the state of polarization of light beam 1122 as it passes through transparent material 1110.

Transparent material 1110 has a characteristic direction indicated by arrow 1130 at entrance face 1111. The characteristic direction of the transparent material is defined in terms of the influence of the transparent material on linearly polarized light passing through the transparent material in the absence of a magnetic field. When linearly polarized light incident upon the transparent material has its direction of polarization aligned with a characteristic direction of the transparent material, then the light emerges from the transparent material linearly polarized. When the direction of polarization of the linearly polarized light makes an arbitrary angle with the characteristic direction of the transparent material, then the light emerges from the transparent material elliptically polarized.

The transparent material has a characteristic direction as a result of electrical anisotropy of the transparent material. The electrical anisotropy of the transparent material gives rise to principal dielectric axes of the transparent material, as disclosed more fully in the textbook by M. Born and E. Wolf, "Principles of Optics" Pergamon Press, Third Edition, 1964.

The Born and Wolf textbook points out that in the general electrical anisotropic case a material will have three characteristic directions corresponding to the three principal axes of the dielectric tensor. The characteristic directions of optical materials has been further explored by H. K. Aben in an article entitled "Characteristic Directions in Optics of Twisted Birefringent Media". *Journal of the Optical Society of America* A/Vol. 3, No. 9, September, 1986, pages 1414–1421. Aben points out that even for inhomogeneous birefringent optical media there are always two perpendicular characteristic directions. Light entering the medium with its electric field vector aligned with either of these characteristic directions will emerge from the medium also linearly polarized. That is, Aben points out that the medium always possesses two mutually orthogonal characteristic directions.

Operation of the Faraday effect electric current sensor will be discussed in terms of a selected characteristic direction.

Angle 1132 is established between the polarization direction of linearly polarized light beam 1122, as shown by arrows 1124, and the selected characteristic direction, shown by arrow 1130, of transparent material 1110 at entrance face 1111. The magnitude of angle 1132 is set to 22.5 degrees.

Emerging light beam 1126 is in general elliptically polarized. The elliptical polarization of light beam 1126 arises from the stress birefringence of transparent material 1110.

Emerging light beam 1126 is analyzed by beam splitting polarization analyzer 1140 into two orthogonal linearly polarized components. The two components are at +45° and −45° relative to the direction 1124 of the electric field vector of the incident light, as that direction is modified by any small twist of the characteristic direction 1130 of the transparent material. The first component 1142 has its direction of polarization 22.5°+45°=67.5° to the characteristic direction of transparent material 1110 at exit face 1113. The second component 1144 has its direction of polarization 22.5°−45°=−22.5° to the characteristic direction of the transparent material 1110 at exit face 1113. The value of 22.5° matches the value of 22.5° chosen for angle 1132.

Polarization analyzer 1140 analyzes the polarization of emerging light beam 1126 relative to the direction of the characteristic direction at the exit face 1113 of transparent material 1110. The orientation of the characteristic direction of the transparent material at the exit face 1113 is not generally parallel to the characteristic direction as shown by arrow 1130 at the entry face 1111. The characteristic direction at the exit face 1113 may differ from the entrance face characteristic direction in the situation wherein transparent material 1110 is an optical fiber and the optical fiber is several meters long, has a core only a few microns in diameter, and is twisted along its longitudinal axis. Also a variation in the characteristic direction between the entry face and the exit face of transparent material 1110 may occur in a solid block type of transparent material as a result of non-uniform stress birefringence resulting from either stress incorporated into the glass as the glass cools, or stresses applied to the glass by hardware applying clamping force to the glass, or for other reasons.

Photodetector 1146 detects component 1142 having a polarization direction at 67.5° to the characteristic direction of transparent material 1110 at exit face 1113. Photodetector 1148 detects component 1144 having polarization at −22.5° to the characteristic direction of transparent material 1110 at exit face 1113. Both detector 1146 and detector 1148 supply respective electrical signals 1150 and 1152 proportional to the intensity of the light reaching the respective detectors. The signals 1150 and 1152 are routed to electronics module 1154.

Electronics module 1154 performs algebraic operations on the strength of the signals 1150 and 1152 delivered by detector 1146 and detector 1148 in order to compute the strength of current J flowing in conductor 1100.

It has been found convenient and useful to utilize the electronics shown in FIG. 1 through FIG. 5 in an electric current sensor using the Faraday effect as shown in FIG. 6. For example, detector #1, 1146, may be mounted on a small chassis having photodiode 160 and op amp U1 mounted therein. Line 1150 then serves as line 162 as shown in FIG. 3, and connects the output signal of op amp U1 to the other parts of the circuit.

Other parts of the circuit comprise U2, U3, and U4. Circuits U2, U3 and U4 may be mounted in electronics package 1154.

Also detector #2, 1148, may include photodiode 161 and op amp U6 mounted in a small chassis. Electronics package 1154 may then contain additional circuit elements such as U7, U8, and U9.

Also electronics package 1154 may contain the divide circuits such as U5, U10 and U13, along with any other necessary components.

Electronics package 1154 produces the ratio R as shown in FIG. 1 on Line 132.

Alternatively, electronics package 1154 may include computer 250 as shown in FIG. 5, along with any necessary additional circuits required by the computer such as the digital voltmeters 228 and 248.

The values of signal A1 and signal R are used to compute the electric current flow in conductor 1100. This calculation is disclosed in greater detail in the related patent disclosed in the first paragraph of the section entitled "Detailed Description" herein.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A light detector comprising:
   a first photodetector;
   means, responsive to said first photodetector, for computing a first ratio of an AC component to a DC component of the intensity of a first light detected by said first photodetector;
   a second photodetector;
   means, responsive to said second photodetector, for computing a second ratio of an AC component to a DC component of the intensity of a second light detected by said second photodetector; and,
   means for computing a quotient by dividing a function of said first ratio by a function of said second ratio.

2. A light detector comprising:
   a first photodetector;
   means, responsive to said first photodetector, for computing a first ratio of an AC component to a DC component of the intensity of a first light detected by said first photodetector;
   means for producing a first average value of said first ratio;
   a second photodetector;
   means, responsive to said second photodetector, for computing a second ratio of an AC component to a DC component of the intensity of a second light detected by said second photodetector;
   means for producing a second average value of said second ratio; and,
   means for computing a quotient by dividing said first average value of said first ratio by said second average value of said second ratio.

3. A light detector as in claim 2 wherein said first photodetector is a photodiode; and said means for computing a first ratio of AC component to DC component, comprises:
   a first operational amplifier (U1) having photo current from said photodiode connected to an input of said first operational amplifier, and said first operational amplifier develops an output voltage substantially proportional to an intensity of a light beam detected by said photodiode;

a circuit (U2, U3) for providing an output voltage substantially proportional to a DC component of said intensity of said light beam detected by said photodiode;

a second operational amplifier (U4) for subtracting said voltage substantially proportional to a DC component of said light beam from a signal substantially proportional to a composite signal substantially proportional to an AC component and a DC component of said intensity of said light beam detected by said photodiode, and said second operational amplifier produces an output voltage substantially proportional to an AC component of said intensity of said light beam detected by said photodiode; and, means for dividing said voltage substantially proportional to an AC component of said intensity of said light beam by said voltage substantially proportional to said DC component of said intensity of said light beam.

4. The apparatus as in claim 3 wherein said circuit for providing an output voltage substantially proportional to a DC component, further comprises:

an integrated circuit digital switched filter.

5. The apparatus as in claim 3 wherein said means for dividing comprises an integrated circuit.

6. The apparatus in claim 2 wherein said means for computing a quotient by dividing said average value of said first ratio by said average value of said second ratio comprises an integrated circuit.

7. The apparatus as in claim 2 wherein said means for computing a quotient by dividing said average value of said first ratio by said average value of said second ratio, comprises:

a first averaging digital voltmeter which digitizes a voltage proportional to said first ratio;

a second averaging digital voltmeter which digitizes a voltage proportional to said second ratio; and, a computer having a first input from said first digital voltmeter and having a second input from said second digital voltmeter, said computer capable of calculating said quotient.

8. A light detection system, comprising:

means for generating a first light beam and a second light beam, said first light beam and said second light beam each having an AC component and a DC component of light intensity;

a first photodetector for detecting said first light beam;

means, responsive to said first photodetector, for computing a first ratio of said AC component to said DC component of said first light beam;

means for producing a first average value of said first ratio;

a second photodetector which detects said second light beam;

means, responsive to said second photodetector, for computing a second ratio of said AC component to said DC component of said second light beam;

means for producing a second average value of said second ratio; and means for computing a quotient by dividing said first average value of said first ratio by said second average value of said second ratio.

9. The apparatus as in claim 8 wherein said means for generating a first light beam and a second light beam comprises:

an electric current sensor using the Faraday effect for detecting electric current flow, said electric current sensor generating said first light beam and said second light beam by separating light launched into said current sensor into light beams of different polarization.

10. The apparatus as in claim 9 wherein said electric current sensor further comprises:

means for generating a light having substantially linear polarization in a predetermined polarization direction;

a material transparent to said light, said material having at least one characteristic direction, and said material exhibiting the Faraday effect in response to a magnetic field generated by said electric current; and means for launching said light having a predetermined polarization direction into said material, and a non-zero predetermined angle established between said polarization direction and said at least one characteristic direction.

11. The apparatus as in claim 9 further comprising:

means for generating light having substantially linear polarization in a predetermined polarization direction;

a material transparent to said light, said material having at least one characteristic direction, and said material exhibiting the Faraday effect in response to a magnetic field generated by said electric current;

means for launching said light having a predetermined polarization direction into said material, and a predetermined angle established between said polarization direction and said at least one characteristic direction; and, means for separating light emerging from said material into a first component having a first polarization to form said first light beam, and into a second component having a second polarization to form said second light beam.

12. A light detection system, comprising:

means for generating light having substantially linear polarization in a predetermined polarization direction;

a material transparent to said light, said material having at least one characteristic direction, and said material exhibiting the Faraday effect in response to a magnetic field generated by an electric current;

means for launching said light having a predetermined polarization direction into said material, and a predetermined angle established between said polarization direction and said characteristic direction;

means for separating light emerging from said material into a first component having a first polarization to form a first light beam, and into a second component having a second polarization to form a second light beam;

a first photodetector which detects said first light beam;

means, responsive to said first photodetector, for computing a first ratio of an AC component to a DC component of said first light beam;

means for producing a first average value of said first ratio;

a second photodetector which detects said second light beam;

means, responsive to said second photodetector, for computing a second ratio of an AC component to a DC component of said second light beam;

means for producing a second average value of said second ratio; and, means for computing a quotient by dividing said first average value of said first ratio by said second average value of said second ratio.

* * * * *